(12) United States Patent
Sakao et al.

(10) Patent No.: US 8,198,197 B2
(45) Date of Patent: Jun. 12, 2012

(54) PLASMA ETCHING METHOD

(75) Inventors: Yosuke Sakao, Nirasaki (JP); Hiroyuki Takahashi, Beverly, MA (US)

(73) Assignee: Tokyo Electron Limited, Tokyo (JP)

( * ) Notice: Subject to any disclaimer, the term of this patent is extended or adjusted under 35 U.S.C. 154(b) by 646 days.

(21) Appl. No.: 12/320,902

(22) Filed: Feb. 6, 2009

(65) Prior Publication Data
US 2009/0233446 A1   Sep. 17, 2009

Related U.S. Application Data

(60) Provisional application No. 61/071,368, filed on Apr. 24, 2008.

(30) Foreign Application Priority Data

Feb. 7, 2008 (JP) ................................. 2008-027847

(51) Int. Cl.
*H01L 21/302* (2006.01)
(52) U.S. Cl. ......... 438/738; 438/714; 438/719; 438/720
(58) Field of Classification Search .................. 438/706, 438/710, 712, 714, 734, 738, 719, 720, 742; 216/58, 67
See application file for complete search history.

(56) References Cited

U.S. PATENT DOCUMENTS

| 2006/0021702 | A1* | 2/2006 | Kumar et al. | 156/345.32 |
| 2008/0230519 | A1* | 9/2008 | Takahashi | 216/64 |
| 2008/0242072 | A1* | 10/2008 | Choi et al. | 438/592 |

FOREIGN PATENT DOCUMENTS

| JP | 2004-149881 | 5/2004 |
| JP | 2006-332555 | 12/2006 |
| JP | 2007-5696 | 1/2007 |

* cited by examiner

*Primary Examiner* — Lan Vinh
(74) *Attorney, Agent, or Firm* — Smith, Gambrell & Russell, LLP (57) ABSTRACT

The present invention is a plasma etching method for etching a surface of a substrate in which a metal nitride film and a silicon film have been respectively formed on a first base film and a second base film that had been side-by-side arranged, with surfaces of the metal nitride film and the silicon film being exposed. At least a surface area of the silicon film is nitrided. A first etching plasma is supplied onto the surface of the substrate so as to etch the metal nitride film and to expose the first base film. A second etching plasma is supplied onto the surface of the substrate so as to etch the silicon film and to expose the second base film.

5 Claims, 6 Drawing Sheets

PLASMA ETCHING METHOD

CROSS REFERENCE TO PRIOR APPLICATIONS

This application claims priority from U.S. Provisional Application No. 61/071,368 filed on Apr. 24, 2008 and Japanese Patent Application No. 2008-027847 filed on Feb. 7, 2008. The entire contents of these applications are incorporated herein by reference.

FIELD OF THE INVENTION

The present invention relates to a technique for simultaneously etching a metal nitride film and a film containing silicon as a main component.

BACKGROUND ART

In parallel to miniaturization of a device, a gate insulation film of a transistor has been required to have an excellent switching performance and a high amplification factor. For this purpose, by narrowing a thickness of a silicon oxide film serving as a gate insulation film, an electric capacity thereof is increased so that an amount of dielectric charge thereof is increased.

However, when the thickness of the silicon oxide film is narrowed, an amount of leak current is increased. In consideration thereof, instead of the silicon oxide film, use of a high-dielectric-constant film, such as a hafnium silicon oxynitride film (HfSiON) containing hafnium (Hf), has been under review. In this type of high-dielectric-constant film, even when it has a large thickness, an amount of dielectric charges can be increased. As a result, an amount of leak current can be restrained. However, when this type of high-dielectric-constant film is used as a gate insulation film, a problem such as a carrier fixation and/or a gate depletion may occur, which raises a threshold voltage in a transistor.

In order to solve the above problem such as the carrier fixation and the gate depletion, it has been under review that, for example, a metal gate film made of a metal or a metal compound is interposed between the aforementioned HfSiON film and a polysilicon film that has been used as a gate electrode heretofore. Herein, when metal gate films are applied to both a p-type transistor and an n-type transistor in one substrate, the metal gate films for the respective transistors have to be made of different materials, which complicates a manufacturing process. Thus, use of a transistor structure in which such a metal gate film is applied only to a p-type transistor has been under review, because increase in a threshold voltage tends to be relatively larger in the p-type transistor.

Figure 6A:
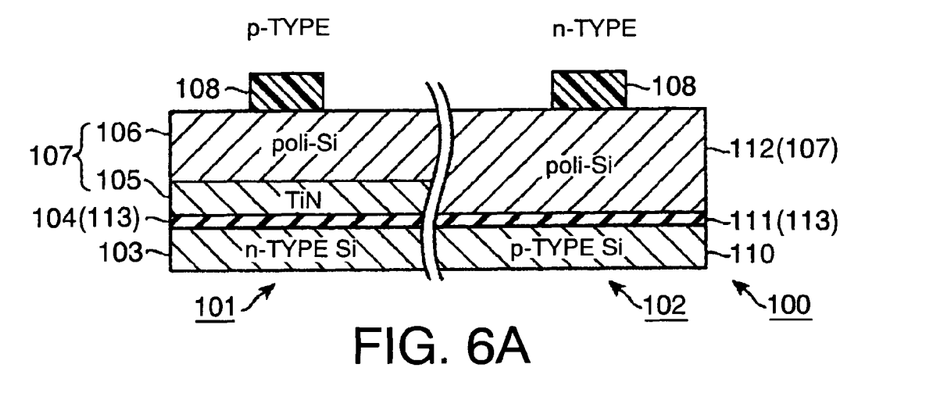
FIGS. 6A to 6C are schematic views for illustrating that a substrate is etched by a conventional etching method.

FIG. 6A shows an example of such a structure. As shown in FIG. 6A, a substrate 100 includes, at a plurality of locations, layer structure parts 101 for forming p-type transistors and layer structure parts 102 for forming n-type transistors, which are spaced apart from each other.

In the layer structure part 101 for forming a p-type transistor, an n-type silicon layer 103, a high-dielectric-constant film such as an HfSiON film 104 functioning as a gate insulation film 113, a metal gate film 105 made of, e.g., TiN (titanium nitride), a polysilicon film 106, and a photoresist mask 108, are laminated in this order from below. The metal gate film 105 and the polysilicon film 106 are the films constituting a gate electrode 107.

On the other hand, in the layer structure part 102 for forming an n-type transistor, a p-type silicon layer 110, a silicon oxide film 111 functioning as a gate insulation film 113, a polysilicon film 112 functioning as a gate electrode 107, and a photoresist mask 108, are laminated in this order from below.

In the substrate 100 having the above structure, in order to form an area into which a field insulation film is to be buried by a plasma etching process, there are performed a step in which the films (the metal gate film 105, the polysilicon film 106, and the polysilicon film 112) located above the gate insulation films 113 (the HfSiON film 104 and the silicon oxide film 111) are etched, and then a step in which the gate insulation films 113 are etched.

In the former etching step, since the metal gate film 105 and the polysilicon film 112 are side-by-side arranged, a process gas that is capable of simultaneously etching these films, such as a chlorinated etching gas, has to be used. The use of such a chlorinated etching gas significantly decreases a selection ratio of the polysilicon film 112 relative to the silicon oxide film 111. Thus, in order to restrain a local film-thickness-decrease of the silicon oxide film 111, it is necessary that the first etching process is adjusted such that the polysilicon film 112 remains when the etching process of the metal gate film 105 is finished, i.e., when the HfSiON film 104 is exposed, and also it is necessary that the polysilicon film 112 is etched by means of a process gas that is capable of achieving a large (high) selection ratio between the polysilicon film 112 and the silicon oxide film 111, such as a hydrogen bromide gas.

Figure 6B:
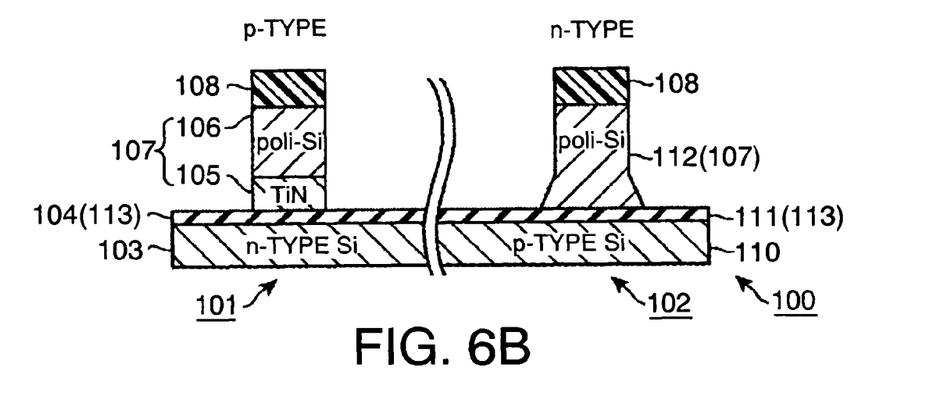
Figure 6C:
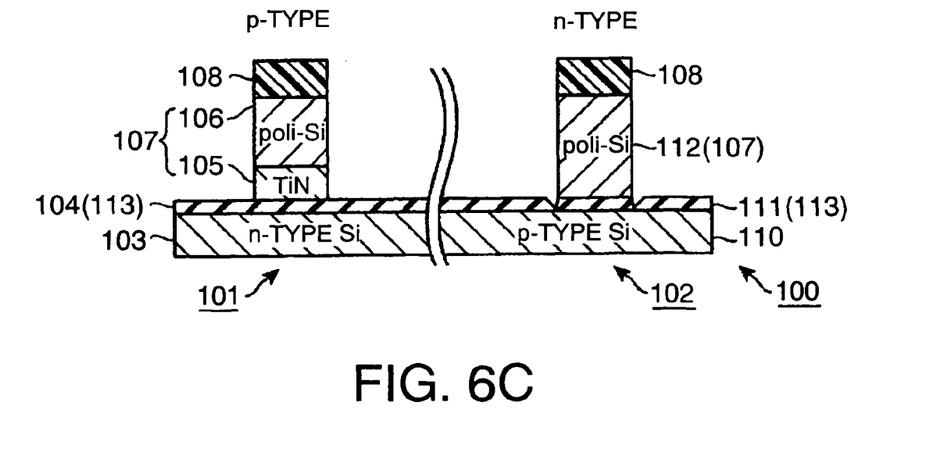

However, when a chlorinated gas is used, it is impossible to achieve a large selection ratio of the metal gate film 105 relative to the polysilicon film 112. When the process conditions for the etching process are adjusted so as to achieve a large selection ratio, as shown in FIG. 6B, a verticality of the etching process is likely to be deteriorated. On the other hand, when the process conditions for the etching process are adjusted so as to achieve a suitable verticality of the etching process, a selection ratio between the metal gate film 105 and the polysilicon film 112 is made smaller. That is, as shown in FIG. 6C, the silicon oxide film 111, for example, is also etched, whereby the thickness of the gate insulation film 113 is locally made thinner.

As described above, there is a trade-off relationship between the shape of the gate electrode 107 and the selection ratio. Therefore, adjustment range of the process conditions for achieving the large selection ratio is considerably narrow, and thus it is difficult to achieve the large selection ratio in practice.

Patent Document 1 (JP2004-149881A (particularly paragraphs 0034 and 0035)), Patent Document 2 (JP2006-332555A (particularly paragraphs 0032 to 0042)) and Patent Document 3 (JP2007-5696A (particularly paragraphs 0051 to 0054)) respectively describe that a substrate is processed by supplying a nitrogen plasma. However, the above problems are not considered at all.

SUMMARY OF THE INVENTION

The present invention has been made in view of the above circumstances. The object of the present invention is to provide a plasma etching method for plasma-etching a metal nitride film and a silicon film which are side-by-side arranged, the plasma etching method being capable of achieving a large etching selection ratio of the metal nitride film relative to the silicon film, while a verticality of the etching process can be suitably maintained.

The present invention is a plasma etching method for etching a surface of a substrate in which a metal nitride film and a silicon film have been respectively formed on a first base film and a second base film that had been side-by-side arranged, with surfaces of the metal nitride film and the silicon film being exposed, the plasma etching method comprising: a nitriding step in which a plasma obtained by making plasma a gas containing nitrogen is supplied onto the surface of the substrate so as to nitride at least a surface area of the silicon film; a first etching step, succeeding the nitriding step, in which a first etching plasma is supplied onto the surface of the substrate so as to etch the metal nitride film and to expose the first base film, the first etching plasma being selected such that an etching selection ratio of the metal nitride film relative to the silicon film containing the nitrided surface area is larger than 1, and that the first base film is not etched at all or is not substantially etched; and a second etching step, succeeding the first etching step, in which a second etching plasma is supplied onto the surface of the substrate so as to etch the silicon film and to expose the second base film, the second etching plasma being selected such that an etching selection ratio of the silicon film containing the nitrided surface area relative to the second base film is larger than that of the first etching plasma, and that the first base film is not etched at all or is not substantially etched.

According to the present invention, in the etching method for etching the surface of the substrate in which the metal nitride film and the silicon film have been respectively formed on the first base film and the second base film that had been side-by-side arranged, with the surfaces of the metal nitride film and the silicon film being exposed, the plasma of the gas containing nitrogen is supplied onto the surface of the plasma so as to nitride the silicon film. Thus, hardness of the silicon film is increased, whereby the silicon film becomes hard to be etched. On the other hand, since the metal nitride film contains a large amount of nitrogen from the first, the metal nitride film is not nitrided. Thus, an etching selection ratio of the metal nitride film relative to the silicon film is increased. Accordingly, after the above nitriding process, when the metal nitride film and the silicon film are etched until the first base film is exposed, the silicon film can remain as a remaining film of a large thickness. For this reason, the remaining film of the silicon film can be efficiently etched in the succeeding step, by using the plasma of a process gas that is selected such that a selection ratio of the silicon film relative to the second base film is large, and that the first base film is not etched. As a result, a desired recess of a suitable shape can be formed, as well as a film-thickness-decrease of the second base film can be effectively restrained.

For example, the plasma etching method may further comprise a step in which the substrate, in which the surfaces of the metal nitride film and the silicon film are exposed, is obtained from a substrate, in which the metal nitride film and the silicon film have been respectively formed on the first base film and the second base film that had been side-by-side arranged and a silicon containing film has been further laminated on the metal nitride film and the silicon film, by etching the silicon containing film.

Preferably, the first base film is a film containing oxygen and metal selected from hafnium, zirconium, and strontium.

In addition, preferably, the first etching plasma contains active species of chlorine.

In addition, preferably, the second base film is a silicon oxide film.

In addition, preferably, the second etching plasma contains active species of bromine.

Alternatively, the present invention is a storage medium storing a computer program executable on a computer, the computer program includes steps for implementing the plasma etching method having the above features.

BEST MODE FOR CARRYING OUT THE INVENTION (Structure of Wafer)

An embodiment of a plasma etching method according to the present invention will be described with reference to FIG. 1A to FIG. 4.

Figure 1A:
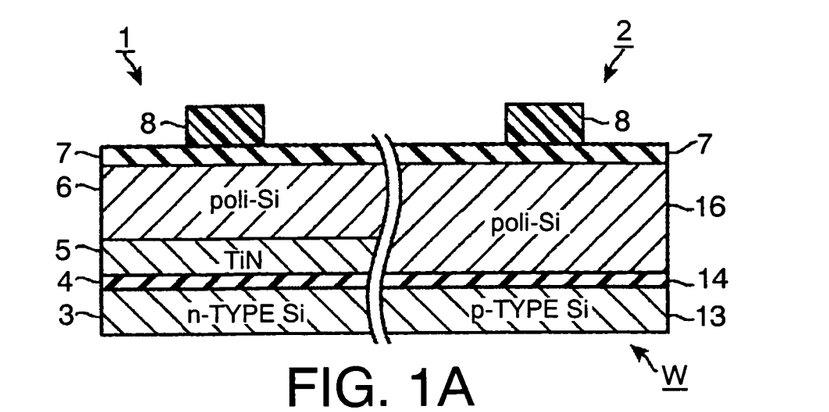
FIGS. 1A to 1C are schematic views showing a part of steps in one embodiment of an etching method according to the present invention.

At first, there is described a semiconductor wafer (hereinafter referred to as "wafer") W which is a substrate to be used in the present invention. As shown in FIG. 1A, the wafer W includes, at a plurality of locations, layer structure parts 1 for forming p-type transistors and layer structure parts 2 for forming n-type transistors, which are side-by-side arranged (hereinafter referred to as "p-type layer structure part 1" and "n-type layer structure part 2").

In the p-type layer structure part 1, for example, an n-type silicon layer 3 in which silicon is doped with impurities such as phosphorus (P), an HfSiON film 4 which is a first base film serving as an insulation film being a high-dielectric-constant film containing, e.g., hafnium (Hf), silicon (Si), oxygen (O), and nitrogen (N), a titanium nitride film 5 which is a metal nitride film, a silicon film 6 made of polycrystal silicon, an anti-reflection film 7, and a patterned photoresist mask 8, are laminated in this order from below. The titanium nitride film 5 and the silicon film 6 are films to constitute a gate electrode 9 by means of the below-described etching process and so on.

On the other hand, in the n-type layer structure part 2, for example, a p-type silicon layer 13 in which silicon is doped with boron (B), a silicon oxide film 14 which is a second base film serving as an insulation film containing, e.g., silicon and oxygen, a silicon film 16 made of polycrystal silicon which is to constitute a gate electrode 19 by means of the below-described etching process and so on, the anti-reflection film 7, and the patterned photoresist mask 8, are laminated in this order from below.

Film thicknesses of the HfSiON film 4 and the silicon oxide film 14 are, e.g., from 2 to 10 nm. A film thickness of the titanium nitride film 5 is, e.g., from 10 to 50 nm. A film thickness of the silicon film 16, namely, a total film thicknesses of the titanium nitride film 5 and the silicon film 6 is, e.g., from 50 to 100 nm.

(Process of Wafer)

Next, an embodiment of the plasma etching method according to the present invention is described.

Figure 1B:
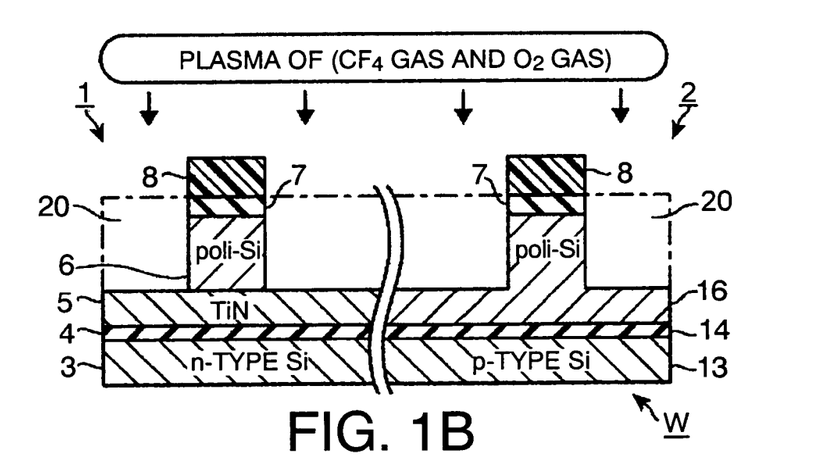
Figure 2A:
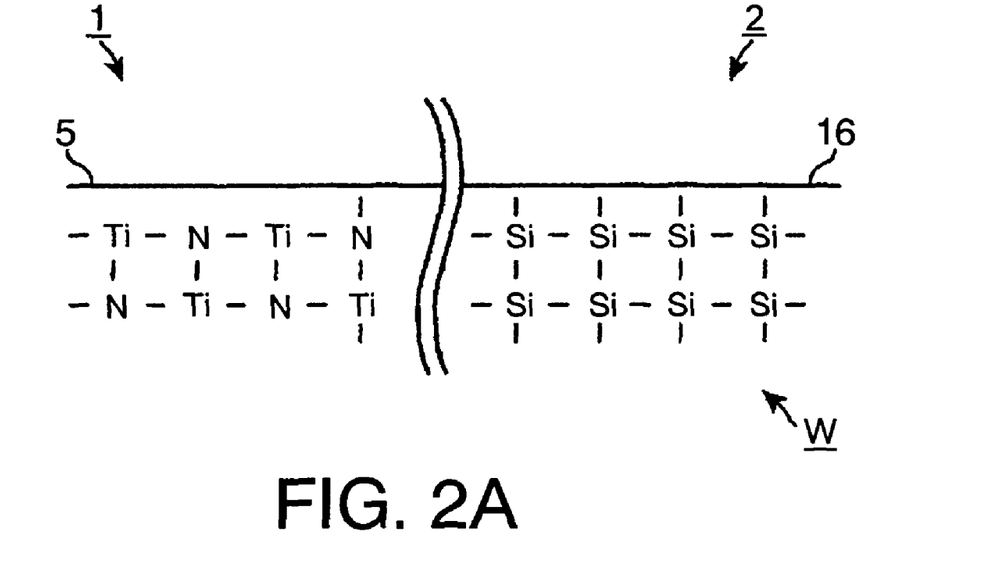
FIGS. 2A and 2B are schematic views showing a part of the steps in the present embodiment.

At first, a process gas, which is composed of a gas containing carbon and fluorine, such as a $CF_4$ gas, and of an oxygen gas, is supplied at a predetermined flow rate to the aforementioned wafer W. By making the process gas plasma, the anti-reflection film 7 is etched with the photoresist mask 8 serving as a mask. Then, the silicon film 6 and the silicon film 16 are etched until the titanium nitride film 5 in the p-type layer structure part 1 is exposed, whereby recesses 20 are formed (FIG. 1B). Due to this etching process, as shown in FIG. 2A, a height position of a surface of the silicon film 16 becomes substantially the same as a height position of a surface of the titanium nitride film 5. In other words, the film thickness of the remaining film of the silicon film 16 becomes substantially the same as the film thickness of the titanium nitride film 5.

Figure 2B:
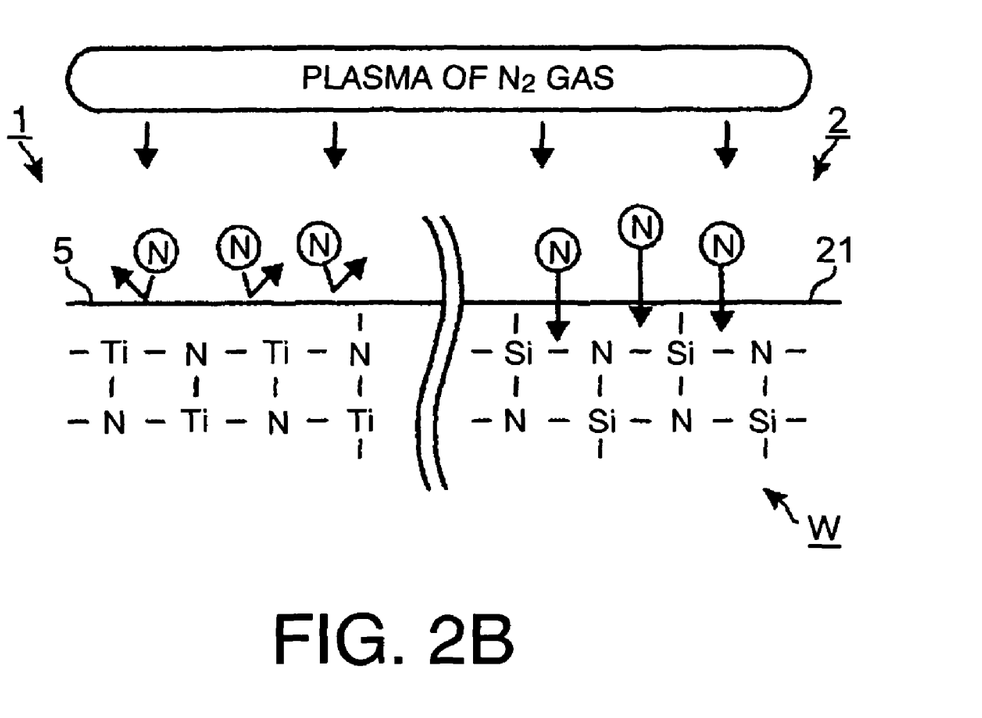

Then, a gas containing nitrogen (N), such as a nitrogen ($N_2$) gas, is supplied at a predetermined flow rate to the wafer W, so that the nitrogen gas is made plasma. When the plasma of the nitrogen gas reaches the silicon film 16 exposed at a bottom surface of the recesses 20, as shown in FIG. 2B, the nitrogen is bonded with the silicon in the silicon film 16, whereby a nitride film 21 made of silicon nitride ($Si_3N_4$) is formed.

Figure 1C:
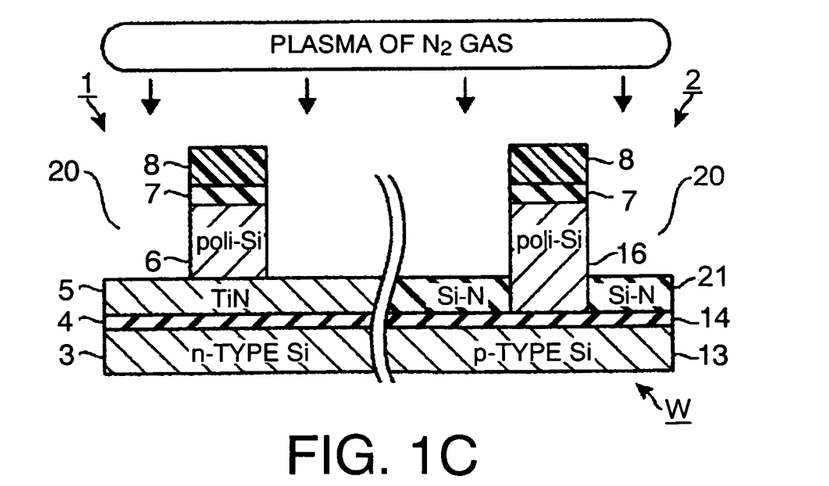

The nitride film 21 has a hardness higher than that of the silicon film 16. That is to say, a bonding strength between the molecules in the silicon film 16 is increased by means of the nitriding process, which lowers a reactivity of this film with an etchant or the like and improves an etching-resistant property thereof. At this time, since the plasma of the nitrogen gas is diffused toward the inside of the silicon film 16, the nitride film 21 is formed even in the inside of the silicon film 16. In addition, as described above, since the film thickness of the remaining film of the silicon film 16 is thin, as shown in FIG. 1C, the nitride film 21 is formed in the overall film-thickness direction.

On the other hand, since the titanium nitride film 5 exposed at a bottom surface of the recesses 20 contains nitrogen, it is difficult for the plasma of the nitrogen gas to penetrate through the titanium nitride film 5. Thus, even when the titanium nitride film 5 comes in contact with the plasma of the nitrogen gas, the titanium nitride film 5 is not nitrided.

Figure 3A:
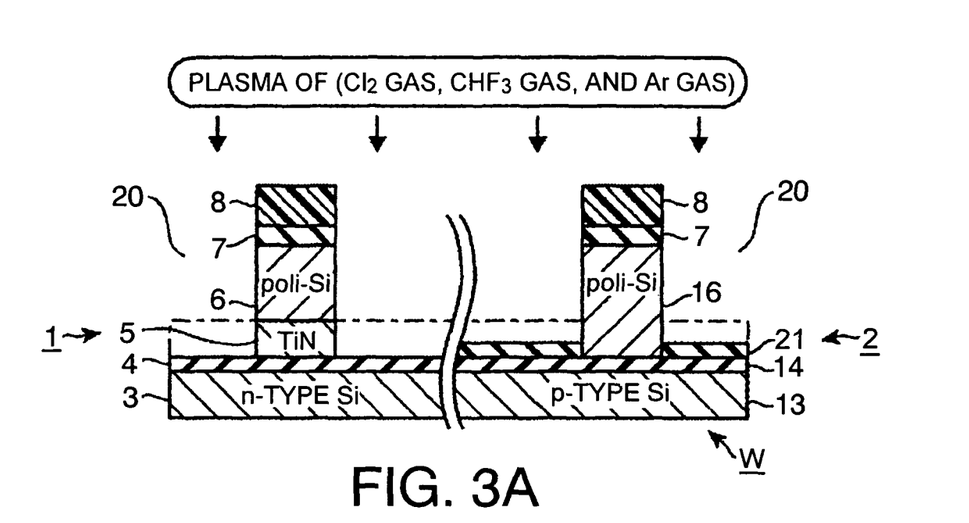
FIGS. 3A and 3B are schematic views showing a part of the steps in the present embodiment.

Then, a process gas containing chlorine ($Cl_2$), such as a chlorine gas, a $CHF_3$ gas, and an argon (Ar) gas, are supplied at predetermined flow rates to the wafer W. Thus, as shown in FIG. 3A, the titanium nitride film 5 and the nitride film 21 are etched by a first etching plasma which is obtained by making the process gas plasma. The nitride film 21 and the titanium nitride film 5 are simultaneously etched by active species of chlorine which serve as an etchant in the plasma, but the nitride film 21 is harder to be etched than the titanium nitride film 5 owing to the above-described nitriding process. Thus, an etching speed of the nitride film 21 is slower, whereby an etching selection ratio of the titanium nitride film 5 relative to the nitride film 21 is larger. As a result, as shown in FIG. 3A, when the etching process for the titanium nitride film 5 is completed so that the HfSiON film 4 is exposed, the silicon oxide film 14 is not exposed but the nitride film 21 remains as a remaining film of a large film thickness.

Upon completion of the etching process, the exposed HfSiON film 4 comes in contact with the plasma of the process gas. However, the HfSiON film 4 is not etched at all or is rarely etched (is not substantially etched) by the plasma. Accordingly, a depth position of the recess 20 in the p-type layer structure part 1 is aligned with an upper end position of the HfSiON film 4. The aforementioned etching step corresponds to a so-called main etching step.

Figure 3B:
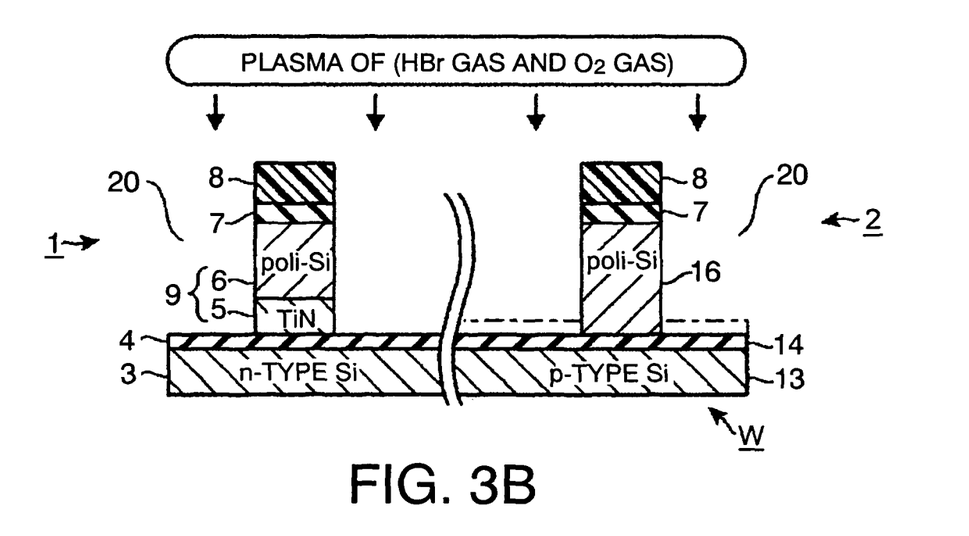

Then, a process gas composed of a hydrogen bromide (HBr) gas and an oxygen gas is supplied at a predetermined flow rate to the wafer W, and thus a so-called over-etching step is performed by a second etching plasma which is obtained by making plasma the process gas (FIG. 3B). The plasma of the process gas contains active species of bromine serving as an etchant. Thus, the silicon film 16 is etched. The plasma provides an infinitely large etching selection ratio of the silicon film 16, i.e., a significantly large etching selection ratio of the silicon film 16, relative to the silicon oxide film 14. Thus, the nitride film 21 is removed so that the silicon oxide film 14 is exposed, without any local etching and/or a film-thickness-decrease of the silicon oxide film 14. At this time, although the HfSiON film 4 comes in contact with the plasma of the process gas, the HfSiON film 4 is not etched at all or is not substantially etched (is rarely etched) by the plasma. Accordingly, the depth positions of the recesses 20 are aligned with the upper end position of the HfSiON film 4 and an upper end position of the silicon oxide film 14.

Figure 4:
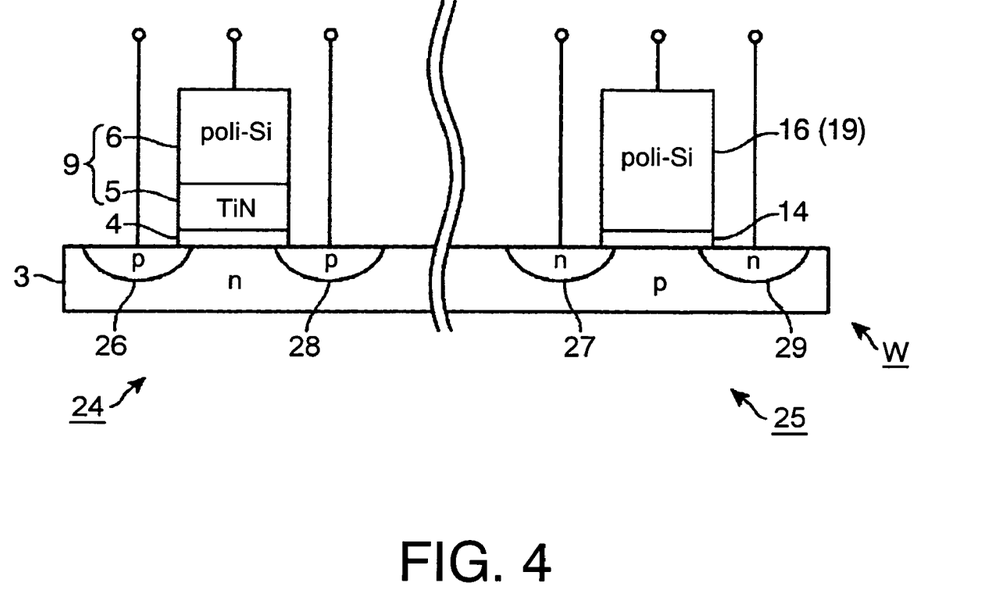
FIG. 4 is a schematic view of an example of a structure formed by the present embodiment.

Subsequently, the HfSiON film 4 and the silicon oxide film 14 are plasma-etched and removed, so that surfaces of the n-type silicon layer 3 and p-type silicon layer 13 are exposed. Then, well regions 26 to 29 are formed in the bottom surfaces of the recesses 20 by performing a diffusion process of phosphorus or boron, for example. In addition, field insulation films are filled into the recesses 20, contact holes are formed in the field insulation films, and metal components are also filled thereinto. As a result, a p-type transistor 24 and an n-type transistor 25 shown in FIG. 4 are formed. In FIG. 4, illustration of the field insulation films is omitted.

(Apparatus Structure)

Next, an example of a plasma etching apparatus for carrying out the plasma etching method according to the present invention is described with reference to FIG. 5.

Figure 5:
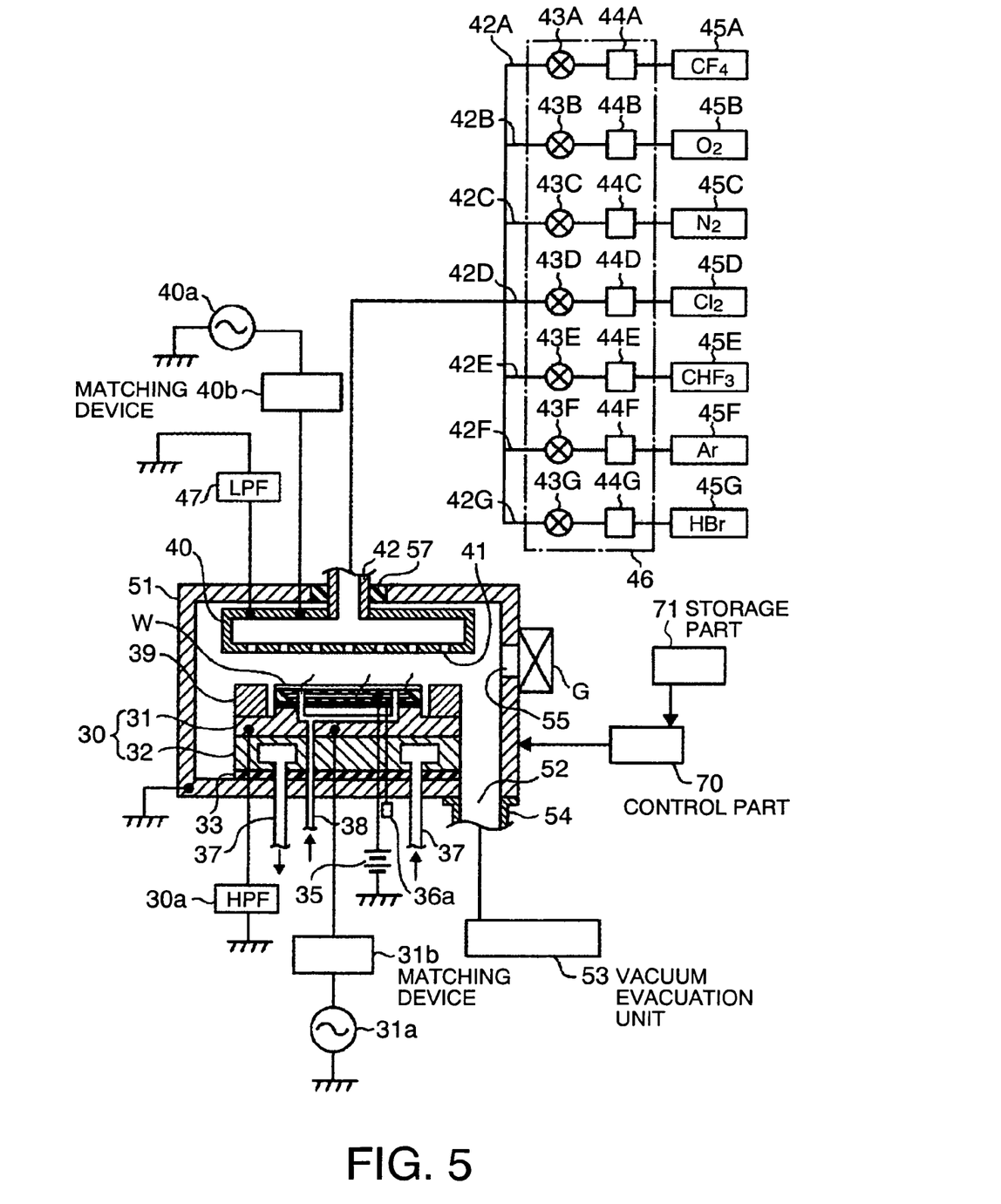
FIG. 5 is a longitudinal sectional view of an example of a structure of an etching apparatus for performing the etching method of the present embodiment.

The plasma etching apparatus shown in FIG. 5 includes a processing vessel 51 formed of a vacuum chamber, a stage 30 arranged at a center on a bottom surface in the processing vessel 51, and an upper electrode 40 arranged on an upper surface of the processing vessel 51. The upper electrode 40 serves us a plasma generating unit. A vacuum exhaust unit 53 including a vacuum pump or the like is connected through an exhaust pipe 54 to an exhaust port 52 formed in the bottom surface of the processing vessel 51. A transfer opening 55 for a wafer W is formed in a wall surface of the processing vessel 51. The transfer opening 55 can be opened and closed by a gate valve G. The processing vessel 51 is grounded.

The stage 30 includes a lower electrode 31 and a support member 32 supporting the lower electrode 31 from below. The stage 30 is disposed on the bottom surface of the processing vessel 51 via an insulation member 33. Arranged in an upper portion of the stage 30 is an electrostatic chuck 34 to which a voltage is applied from a high-voltage D.C. power supply 35. Thus, a wafer W can be electrostatically absorbed on the stage 30. The electrostatic chuck 34 has a plurality of through holes 34a passing vertically through the electrostatic chuck 34. The stage 30 has a heater 36 connected to a power supply 36a, whereby the wafer W on the stage 30 can be heated. Further, formed in the stage 30 is a temperature adjusting channel 37 through which a predetermined temperature adjusting medium passes, whereby the wafer W can be maintained at a set temperature during the etching process.

Furthermore, formed inside the stage 30 is a gas channel 38 through which a thermal conductive gas such as an He (helium) gas is supplied as a backside gas. The gas channel 38 is opened in an upper surface of the stage 30 at a plurality of locations. These openings are in communication with the through holes 34a formed in the electrostatic chuck 34.

The lower electrode 31 is grounded via a highpass filter (HPF) 30a. Connected via a matching device 31b to the lower electrode 31 is a radiofrequency power supply 31a that supplies a radiofrequency of 13.56 MHz. The radiofrequency, which is supplied from the radiofrequency power supply 31a as a so-called bias power, is applied to the lower electrode 31 so as to draw ions in a plasma into the wafer W. A focus ring 39 is disposed on an outer circumference of the lower electrode 31 so as to surround the electrostatic chuck 34. Thus, when a plasma is generated, the plasma can focus on the wafer W placed on the stage 30 via the focus ring 39.

The upper electrode 40 is formed to have a hollow structure. A number of holes 41 for supplying a process gas into the processing vessel 51 in a dispersed manner are uniformly, for example, formed in a lower surface of the upper electrode 40, and thus a so-called gas showerhead is constituted. A gas inlet pipe 42 serving as a gas supply channel is connected to a center of an upper surface of the upper electrode 40. The gas inlet pipe 42 passes through the center of the upper surface of the processing vessel 51 via an insulation member 57. The gas inlet pipe 42 is branched into, e.g., seven branch pipes 42A to 42G on an upstream side thereof. The branch pipes 42A to 42G are respectively connected to gas supply sources 45A to 45G via valves 43A to 43G and flow-rate controllers 44A to 44G. The valves 43A to 43G and the flow-rate controllers 44A to 44G are structural elements constituting a so-called gas supply system 46.

The upper electrode 40 is grounded via a lowpass filter (LPF) 47. Connected via a matching device 40b to the upper electrode 40 is a radiofrequency power supply 40a that supplies a radiofrequency of, e.g., 60 MHz, which is higher than the radiofrequency supplied from the radiofrequency power supply 31a. The radiofrequency supplied from the radiofrequency power supply 40a makes a gas plasma.

The plasma etching apparatus is provided with a control part 70 formed of, e.g., a computer. The control part 70 includes a program, a memory, and a data processing part formed of a CPU. The program incorporates commands for sending control signals from the control part 70 to the respective units of the plasma etching apparatus so as to implement the respective above-described steps. The memory has an area in which values of various process parameters such as a process pressure, a process temperature, a process period, a gas flow rate, and an electric power are written. When the CPU implements the commands of the program, predetermined values of the process parameters are read out, and control signals corresponding to the parameter values are sent to the respective units of the plasma etching apparatus. The program (which may further include a program relating to an input operation of the process parameters and a display thereof) is generally stored in a storage part formed of a computer storage medium such as a flexible disc, a compact disc, or an MO (photomagnetic disc), and is installed in the control part 70.

(Operation of Plasma Etching Apparatus)

Next, an operation of the above plasma etching apparatus is described. The gate valve G is opened at first, and a 300 mm wafer W is loaded into the processing vessel 51 and is placed on the stage 30 by a transfer mechanism, not shown. Then, the gate valve G is closed, and a backside gas is supplied from the gas channel 38. After the inside of the processing vessel 51 has been maintained at a predetermined vacuum degree by the vacuum exhaust unit 53, process gasses such as a $CF_4$ gas and an oxygen gas are supplied at predetermined flow rates from the gas supply system 46. Subsequently, a radiofrequency of 60 MHz for generating a plasma is supplied to the upper electrode 40 at a predetermined voltage, so that the process gases are made plasma. At the same time, as a radiofrequency for biasing, a radiofrequency of 13.56 MHz is supplied to the lower electrode 31 at a predetermined voltage. As described above, the anti-reflection film 7, the silicon film 6, and the silicon film 16 are etched by means of this plasma.

Then, the supply of the radiofrequencies and the supply of the process gases are stopped, and the processing vessel 51 is evacuated and vacuumized. Then, a nitrogen gas is supplied at a predetermined flow rate of, e.g., 300 sccm, into the processing vessel 51, and the inside of the processing vessel 51 is set at a predetermined vacuum degree of, e.g., 1.33 Pa (10 mTorr). In addition, radiofrequencies of predetermined powers of, e.g., 100 W and 50 W are supplied from the upper electrode 40 and the lower electrode 31, respectively, so that the nitrogen gas is made plasma. Thus, as described above, the silicon film 16 is nitrided.

Thereafter, the supply of the radiofrequencies and the supply of the process gas are stopped, and the processing vessel 51 is evacuated and vacuumized. Then, a chlorine gas, a $CHF_3$ gas, and an argon gas, which serve as process gases, are supplied at predetermined flow rates of, e.g., 80, 40, and 180 sccm, respectively, into the processing vessel 51, and the inside of the processing vessel 51 is set at a predetermined vacuum degree of, e.g., 1.33 Pa (10 mTorr). In addition, radiofrequencies of predetermined powers of, e.g., 100 W and 50 W are supplied from the upper electrode 40 and the lower electrode 31, respectively, so that the process gases are made plasma. As described above, the plasma is supplied to the wafer W, so that the titanium nitride film 5 and the nitride film 21 are etched.

Similarly, the supply of the radiofrequencies and the supply of the process gases are stopped, and the processing vessel 51 is evacuated and vacuumized. Then, new process gases, i.e., a hydrogen bromide gas and an oxygen gas are supplied at predetermined flow rates of, e.g., 200 and 15 sccm, respectively, into the processing vessel 51, and the inside of the processing vessel 51 is set at a predetermined vacuum degree of, e.g., 4.0 Pa (30 mTorr). In addition, radiofrequencies of predetermined powers of, e.g., 200 W and 100 W are supplied from the upper electrode 40 and the lower electrode 31, respectively, so that the new process gases are made plasma. As described above, the plasma is supplied to the wafer W, so that the over-etching step is performed.

After that, the supply of the radiofrequencies and the supply of the process gases are stopped, and the processing vessel 51 is evacuated and vacuumized. Then, the wafer W is unloaded from the processing vessel 51.

According to the aforementioned embodiment, when the recesses 20 are formed in the titanium nitride film 5 and the silicon film 16 which have been respectively formed on the HfSiON film 4 and the silicon oxide film 14 that had been side-by-side arranged, the silicon film 6 on the titanium nitride film 5 and the silicon film 16 are firstly etched until the titanium nitride film 5 is exposed. Then, the plasma of the nitrogen gas is supplied onto the wafer W. Due to the plasma of the nitrogen gas, the silicon film 16 adjacent to the titanium nitride film 5 is nitrided so as to become the nitride film 21, while the titanium nitride film 5 containing a large amount of nitride is not nitrided. Thus, a hardness of the silicon film 16 (nitride film 21) is increased so that the silicon film 16 becomes hard to be etched. That is, a selection ratio of the titanium nitride film 5 relative to the silicon film 16 (nitride film 21) can be increased. As a result, as described above, when the titanium nitride film 5 is etched until the HfSiON film 4 is exposed, the silicon film 16 (nitride film 21) can remain as a remaining film of a large film thickness.

Therefore, when the subsequent over-etching step is performed, the hydrogen bromide gas can be used. Herein, the hydrogen bromide gas can provide a large selection ratio of the silicon film 16 relative to the silicon oxide film 14, as well as the hydrogen bromide gas will not etch the HfSiON film 4 at all or will rarely etch the same. Consequently, a filmthickness-decrease of the silicon oxide film 14 can be restrained. In addition, the depth positions of the recesses 20 can be aligned with the upper end positions of the HfSiON film 4 and the silicon oxide film 14 in a plane of the wafer W.

Further, since the silicon film 16 (nitride film 21) can remain as a remaining film of a large thickness, the conditions for etching the titanium nitride film 5 and the nitride film 21 can be adjusted more optionally. As a result, there can be employed suitable etching conditions by which each recess 20 can have a suitable shape, i.e., by which vertical gate electrodes 9 and 19 can be formed. Since the nitrogen gas used in the nitriding process does not affect the shape of the recess 20 and the films other than the silicon film 16, each recess 20 can be formed to have a suitable shape as described above.

A gas for nitriding the silicon film 16 may be supplied together with an inert gas, such as an argon gas, serving as a dilution gas. In addition, a gas for nitriding the silicon film 16 may contain nitrogen (N) such as an ammonia ($NH_3$) gas. As described above, the titanium nitride film 5 may be replaced with another metal nitride film that will not be nitrided by a plasma of nitrogen. Further, the silicon films 6 and 16 may be made of different materials. Furthermore, the silicon film 16 may include other elements, as long as the silicon film 16 contains silicon as a main component.

Still furthermore, in the above embodiment, the HfSiON film 4 is taken as an example of a high-dielectric-constant film. However, as a gate insulation film below the titanium nitride film 5, there may be used another film containing oxygen and metal, such as zirconium and strontium in addition to hafnium.

Moreover, in the above embodiment, the silicon film 16 is nitrided in the overall film-thickness direction. However, it is sufficient that at least a surface area of the silicon film 16 is nitrided.

In addition, in the above embodiment, although a chlorine gas, a $CHF_3$ gas, and an argon gas are used as the process gases for etching the titanium nitride film 5 and the nitride film 21, it is sufficient that the process gas contains a chlorine gas. For example, a chlorine gas and an argon gas may be used.

EXAMPLE

Next, an experiment conducted for confirming the effect of the present invention is described. In the experiment, two wafers W, each having the structure shown in FIG. 1A, were etched by the aforementioned plasma etching apparatus up to the upper end surfaces of the titanium nitride films 5.

Thereafter, one wafer W was subjected to a nitriding process, which was performed under the conditions shown below. The other wafer W was not subjected to the nitriding process.

Following thereto, the titanium nitride films 5 of the two wafers W were respectively etched under the etching conditions shown below. Then, a selection ratio between the titanium nitride film 5 and the silicon film 16 (nitride film 21) at this time was calculated for each wafer W. The selection ratio was calculated in the following manner. Namely, with the use of a measuring unit for an etching-finish-time-point (illustration omitted in FIG. 5) disposed on the plasma etching apparatus, there were measured etching periods starting from a time point at which the etching process had been started to respective time points at which height positions of the bottom surfaces of the recesses 20 respectively reached the upper surface of the HfSiON film 4 and the upper surface of the silicon oxide film 14. Then, a ratio between the etching periods was calculated (the etching period required for the titanium nitride film 5 was divided by the etching period required for the silicon film 16 (nitride film 21)).

(Conditions for Nitriding Process)
Process pressure: 1.33 Pa (10 mTorr)
Power supplied to upper electrode 40: 500 W
Power supplied to lower electrode 31: 700 W
Gas: Nitrogen ($N_2$) gas=300 sccm
Process period: 60 seconds (Etching Conditions)
Process pressure: 1.33 Pa (10 mTorr)
Power supplied to upper electrode 40: 100 W
Power supplied to lower electrode 31: 50 W
Process gas: chlorine gas/$CHF_3$ gas/argon gas=80/ 40/180 sccm (Experiment Result)
The selection ratio of the wafer W that had been subjected to the nitriding process, and the selection ratio of the wafer W that had not been subjected to the nitriding process, were calculated. The result is as follows.
Wafer W subjected to the nitriding process: 6.5
Wafer W not subjected to the nitriding process: 5.5

Namely, it could be understood that the etching speed of the silicon film 16 relative to the titanium nitride film 5 was made slower by the nitriding process. This can provide wider options for adjusting the etching conditions, whereby conditions for forming the vertical recesses 20 can be easily established, for example.

Moreover, the wafer W, which had been subjected to the nitriding process and the etching process for the titanium nitride film 5 so that the HfSiON film 4 had been exposed, was subjected to an over-etching process under the following conditions. In this case, the HfSiON film 4 was not etched. Thus, in both of the p-type layer structure part 1 and the n-type layer part 2, the depth positions of the recesses 20 were aligned with the upper surface positions of the HfSiON film 4 and the silicon oxide film 14. That is to say, no local film-thickness-decrease of the gate insulation film was confirmed.

(Etching Conditions)
Process pressure: 4.0 Pa (30 mTorr)
Power supplied to upper electrode 40: 200 W
Power supplied to lower electrode 31: 100 W
Process gas: hydrogen bromide gas/oxygen gas=200/ 15 sccm

The invention claimed is:

1. A plasma etching method for etching a surface of a substrate in which a metal nitride film and a silicon film have been respectively formed on a first base film and a second base film that had been side-by-side arranged, with surfaces of the metal nitride film and the silicon film being exposed, the plasma etching method comprising:

a nitriding step in which a plasma obtained by making plasma a gas containing nitrogen is supplied onto the surface of the substrate so as to nitride at least a surface area of the silicon film;

a first etching step, succeeding the nitriding step, in which a first etching plasma is supplied onto the surface of the substrate so as to etch the metal nitride film and to expose the first base film, the first etching plasma being selected such that an etching selection ratio of the metal nitride film relative to the silicon film containing the nitrided surface area is larger than 1, and that the first base film is not etched at all or is not substantially etched; and a second etching step, succeeding the first etching step, in which a second etching plasma is supplied onto the surface of the substrate so as to etch the silicon film and to expose the second base film, the second etching plasma being selected such that an etching selection ratio of the silicon film containing the nitrided surface area relative to the second base film is larger than that of the first etching plasma, and that the first base film is not etched at all or is not substantially etched, wherein the substrate includes a p-type layer structure part for forming a p-type transistor and a n-type layer structure part for forming a n-type transistor, the p-type layer structure part includes a n-type silicon layer, the first basefilm, the metal nitride film and the silicon film in this order from below, the n-type layer structure includes a p-type silicon layer, the second base film and the silicon film in this order from below, the silicon film in the p-type layer structure part and the silicon film in the n-type layer structure part are etched by a process gas composed of a gas containing carbon and fluorine and of an oxygen gas, until the metallic nitride film on the p-type layer part is exposed, whereby a recess is formed, before the nitriding step, and in the second etching step, the second base film is exposed such that upper end positions of the first base film and the second base film are aligned.

2. The plasma etching method according to claim 1, wherein the first base film is a film containing oxygen and metal selected from hafnium, zirconium, and strontium.

3. The plasma etching method according to claim 1, wherein the first etching plasma contains active species of chlorine.

4. The plasma etching method according to claim 1, wherein the second base film is a silicon oxide film.

5. The plasma etching method according to claim 4, wherein the second etching plasma contains active species of bromine.

* * * * *